(12) United States Patent
Feng (10) Patent No.: US 10,396,066 B2
(45) Date of Patent: Aug. 27, 2019

(54) ELECTRO-STATIC DISCHARGE TRANSISTOR ARRAY APPARATUS

(71) Applicants: Semiconductor Manufacturing International (Shanghai) Corporation, Shanghai (CN); Semiconductor Manufacturing International (Beijing) Corporation, Beijing (CN)

(72) Inventor: JunHong Feng, Shanghai (CN)

(73) Assignees: SEMICONDUCTOR MFG. INTL. (SHANGHAI) CORP., Shanghai (CN); SEMICONDUCTOR MFG. INTL. (BEIJING) CORP., Beijing (CN)

( * ) Notice: Subject to any disclaimer, the term of this patent is extended or adjusted under 35 U.S.C. 154(b) by 0 days.

(21) Appl. No.: 15/980,081

(22) Filed: May 15, 2018

(65) Prior Publication Data

US 2019/0067270 A1   Feb. 28, 2019

(30) Foreign Application Priority Data

Aug. 22, 2017   (CN) .......................... 2017 1 0722966

(51) Int. Cl.
*H01L 23/62* (2006.01)
*H01L 27/02* (2006.01)
*H01L 23/34* (2006.01)

(52) U.S. Cl.
CPC .......... *H01L 27/0266* (2013.01); *H01L 23/34* (2013.01)

(58) Field of Classification Search
CPC ... H01L 23/60; H01L 27/0248; H01L 27/027; H01L 27/0292; H01L 23/34

USPC ....................................................... 257/355
See application file for complete search history.

(56) References Cited

U.S. PATENT DOCUMENTS

2006/0091490 A1* 5/2006 Chen ................... H01L 29/7391
                                                                    257/458
2006/0110844 A1* 5/2006 Lee ....................... H01L 21/187
                                                                    438/57

\* cited by examiner

*Primary Examiner* — Theresa T Doan
(74) *Attorney, Agent, or Firm* — Brinks Gilson & Lione (57) ABSTRACT

The present application discloses an electro-static discharge (ESD) transistor array apparatus, and relates to the field of semiconductor technologies. The ESD transistor array apparatus may include: a semiconductor substrate, the semiconductor substrate including a semiconductor layer, a doped region on the semiconductor layer, and a substrate contact region, where the doped region and the substrate contact region are isolated, and where the substrate contact region includes at least a first contact region part separately disposed on two sides of the doped region; multiple gates arranged in parallel on the doped region, where a direction of extension of the multiple gates is in parallel with a direction of extension of the first contact region part; and a dissipation layer contact member disposed on each gate along the direction of extension of the gate, where density of the dissipation layer contact member decreases with a decrease in a distance from the gate on which the dissipation layer contact member is located to the first contact region part on a corresponding side. By means of the present disclosure, uniform heat dissipation of an ESD transistor array apparatus can be achieved.

14 Claims, 6 Drawing Sheets

ELECTRO-STATIC DISCHARGE TRANSISTOR ARRAY APPARATUS

RELATED APPLICATIONS

The present application claims priority to Chinese Patent Appln. No. 201710722966.X, filed Aug. 22, 2017, the entire disclosure of which is hereby incorporated by reference.

BACKGROUND

Technical Field

The present disclosure relates to the field of semiconductor technologies, and in particular, to an electro-static discharge (ESD) transistor array apparatus.

Related Art

In an ESD device of a fin field-effect transistor (FinFET) type, heat dissipation capability is a key factor related to device performance. Generally, when more heat is dissipated, the ESD performance is better. Currently, research has found that the thinner a fin is, the more difficult heat dissipation will be, causing poorer ESD performance. However, heat dissipation is easier on a cone-shaped fin formed on a bulk silicon substrate. Therefore, this can improve the performance of the ESD device.

Figure 1A:
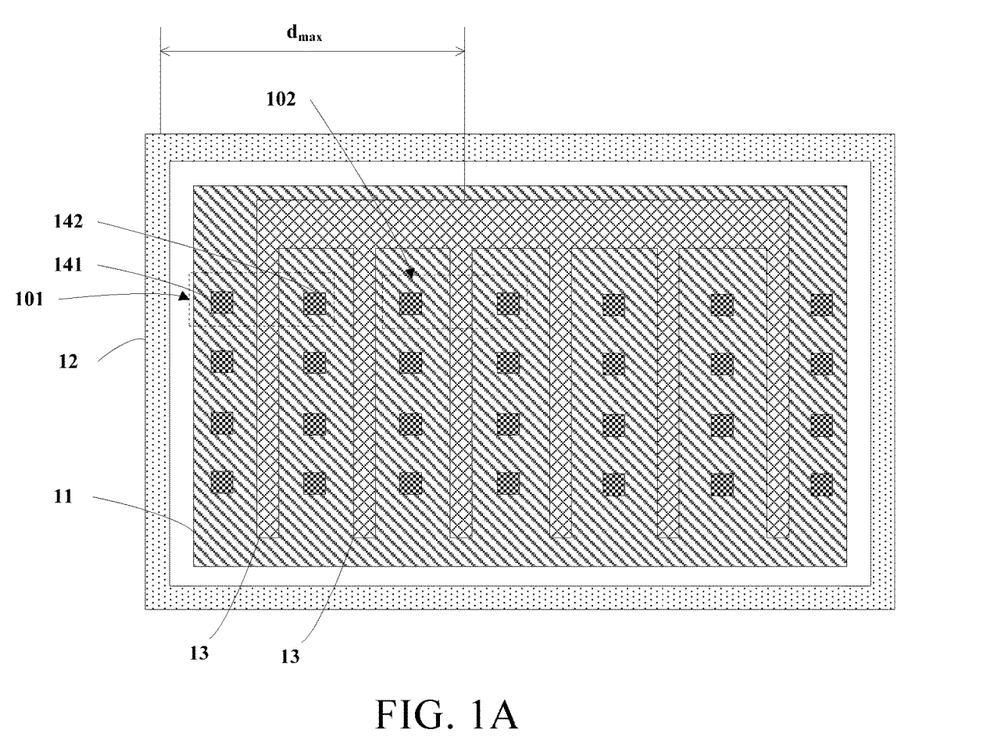
FIG. 1A is a schematic top view of an ESD transistor array apparatus in the prior art.

Currently, a gate-grounded N-channel metal oxide semiconductor (GGNMOS) array apparatus manufactured on the fin may be used as an ESD transistor array apparatus. FIG. 1A is a schematic top view of an ESD transistor array apparatus in the prior art. The ESD transistor array apparatus shown in FIG. 1A may be, for example, a GGNMOS transistor array apparatus. The ESD transistor array apparatus includes: an active region 11 on a silicon substrate and a substrate contact region 12, and the active region 11 and the substrate contact region 12 are isolated by a shallow trench isolation (STI). The ESD transistor array apparatus further includes: multiple gates 13 on the active region, and multiple source contact members 141 and multiple drain contact members 142 that are separately on two sides of each gate, where a source is formed below each source contact member, and a drain is formed below the drain contact member. Herein, each dashed line box may indicate one ESD transistor (for example, a GGNMOS transistor) device. For example, FIG. 1A shows an ESD transistor 101 on an edge of the array and an ESD transistor 102 in the middle region of the array. For example, a distance from a gate of the ESD transistor 102 to a substrate doped region 12 on the left of the active region is the greatest, and may be $d_{max}$.

Figure 1B:
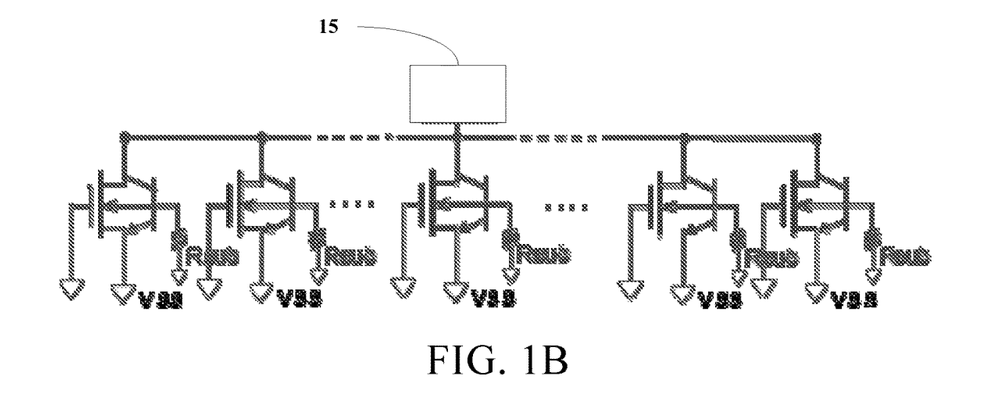
FIG. 1B is a schematic diagram of a circuit structure of the ESD transistor array apparatus in the prior art.

FIG. 1B is a schematic diagram of a circuit structure of the ESD transistor array apparatus in the prior art. The circuit structure shown in FIG. 1B corresponds to the ESD transistor array apparatus shown in FIG. 1A. FIG. 1B shows that ESD transistors of the array are all GGNMOS transistor devices, that is, a gate of each NMOS transistor is grounded. The NMOS transistor has a horizontally parasitic n-p-n (source-p-typed substrate-drain) transistor (that is, a transistor). A source of each NMOS transistor is grounded, and a drain is connected to an output pad 15.

During normal operation, the NMOS transistor is not turned on. When ESD occurs, an avalanche occurs in a depletion region of the drain and the substrate, accompanied by generation of an electron hole pair. Some generated electron holes are absorbed by the source, and others flow through the substrate. Because substrate resistance $R_{sub}$ exists, a substrate voltage increases. When a PN junction between the substrate and the source is forward-biased, electrons are transmitted from the source and enter the substrate. These electrons are accelerated under the action of an electric field between the source and the substrate, to generate collision ionization between the electrons and the electron holes, thereby generating more electron hole pairs, continuously increasing a current flowing through the n-p-n transistor, and finally causing second breakdown to the NMOS transistor. In this case, the breakdown is no longer reversible, and the NMOS transistor is damaged.

Figure 1C:
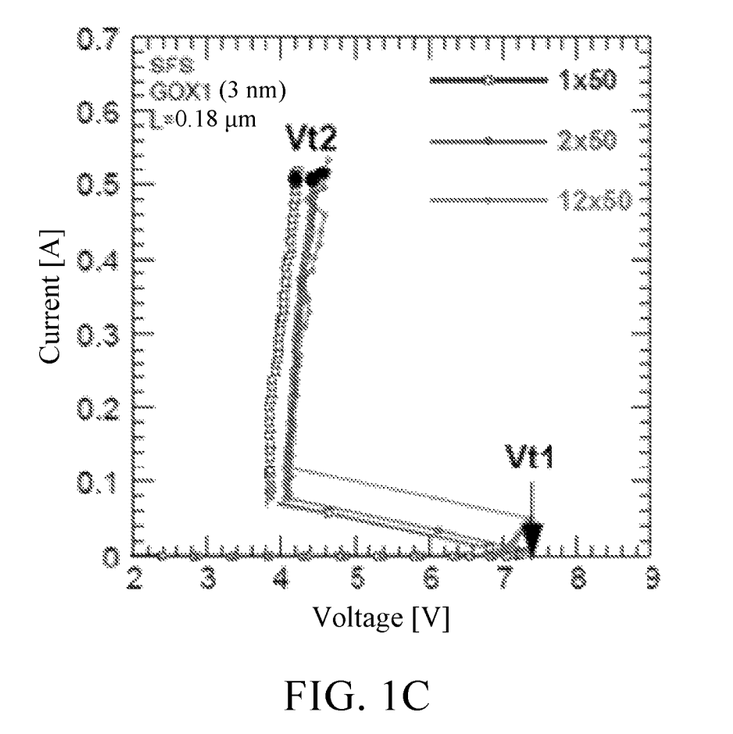
FIG. 1C is an I-V curve diagram of a tested existing ESD transistor array apparatus.

FIG. 1C is an I-V curve diagram of a tested existing ESD transistor array apparatus. Vt1 is a voltage when a transistor on which the PN junction between the substrate and the source is forward-biased and parasitized is turned on, and Vt2 is a voltage when second breakdown occurs in the NMOS transistor. In FIG. 1C, 1×50, 2×50, and 12×50 respectively indicate device quantities of the array apparatus. Herein, a condition that the ESD transistor array apparatus can work evenly is as follows: A voltage of each NMOS transistor reaches Vt1, and it should be ensured that no voltage of any NMOS transistor reaches Vt2 before the voltage of each NMOS transistor reaches Vt1. Otherwise, if a voltage of an NMOS transistor reaches Vt2, the device may be damaged.

Research has found that it is the easiest to turn on a device (for example, the ESD transistor 102 shown in FIG. 1A) located in the middle region of the ESD transistor array apparatus. After being turned on, the device generates heat, but heat dissipation of the device is not favorable, causing much heat to be confined in the middle region of the array. Consequently, a voltage of the device in the middle region quickly reaches Vt2 more easily, and at this time, a device on an edge of the array may not be turned on yet, causing the array apparatus to work unevenly, and affecting the performance of the array apparatus.

SUMMARY

The inventor of the present disclosure have found that during operation of existing ESD transistor array apparatus, much heat generated by the transistor device of the existing ESD transistor array apparatus is easily confined in a middle region of an array, affecting a performance of the array apparatus.

A technical problem addressed by the present disclosure is to provide an ESD transistor array apparatus that provides uniform heat dissipation of an array apparatus during operation.

In one aspect of the present disclosure, an ESD transistor array apparatus is provided. The ESD transistor may include: a semiconductor substrate, the semiconductor substrate including a semiconductor layer, a doped region on the semiconductor layer, and a substrate contact region, where the doped region and the substrate contact region are isolated, and where the substrate contact region includes at least a first contact region part separately disposed on two sides of the doped region; multiple gates arranged in parallel on the doped region, where a direction of extension of the multiple gates is in parallel with a direction of extension of the first contact region part; and a dissipation layer contact member disposed on each gate along the direction of extension of the gate, where density of the dissipation layer contact member decreases with a decrease in a distance from the gate on which the dissipation layer contact member is located to the first contact region part on a corresponding side.

In some implementations, one dissipation layer contact member is disposed on each gate or multiple dissipation layer contact members arranged in parallel are disposed on each gate.

In some implementations, each dissipation layer contact member disposed on each gate comprises multiple contact member segments, where a quantity of the multiple contact member segments disposed on each gate decreases with a decrease in a distance from the gate on which the multiple contact member segments are located to the first contact region part on a corresponding side.

In some implementations, the multiple contact member segments of each dissipation layer contact member disposed on a gate having a farthest distance from the first contact region part on the corresponding side are integrally connected.

In some implementations, the multiple contact member segments of each dissipation layer contact member disposed on each gate having a distance that is not a farthest from the first contact region part on the corresponding side are separated from each other.

In some implementations, the dissipation layer contact member is in a suspension state.

In some implementations, materials of the dissipation layer contact member include tungsten.

In some implementations, the ESD transistor array apparatus further includes: at least one source and at least one drain in the doped region that are arranged on two side of each gate along the direction of extension of the gate.

In some implementations, a source or a drain between adjacent gates is a source or a drain shared by the adjacent gates.

In some implementations, the ESD transistor array apparatus further includes: a source contact member on each source and a drain contact member on each drain.

In some implementations, the substrate contact region further includes a second contact region part intersecting with the direction of extension of the first contact region part, where the first contact region part and the second contact region part jointly surround the doped region.

In some implementations, the ESD transistor array apparatus further includes a trench isolation portion isolating the doped region from the substrate contact region.

In some implementations, the doped region is an active region; and the doped region includes multiple doped semiconductor fins isolated on the semiconductor layer, where each gate traverses at least one semiconductor fin.

In some implementations, the ESD transistor array apparatus includes multiple ESD transistors, where each gate and each source and drain on two sides of the gate are used as a gate, a source, and a drain of each ESD transistor, and the ESD transistor is a GGNMOS transistor.

In implementations of the ESD transistor array apparatus of the present disclosure, a dissipation layer contact member is disposed on each gate of the ESD transistor array apparatus, and the density of the dissipation layer contact member decreases with a decrease in a distance from the gate on which the dissipation layer contact member is located to a first contact region part on a corresponding side. As a result, the density of a dissipation layer contact member in the middle region of the ESD transistor array apparatus is the highest, and a dissipation layer contact member closer to the first contact region part has lower density. This helps dissipate more heat confined in the middle region. In addition, a device located on an edge is not significantly affected. Therefore, uniform heat dissipation of the entire ESD transistor array apparatus can be achieved, and further, the entire ESD transistor array can work evenly.

Exemplary embodiments and implementations of the present disclosure are described in detail below with reference to the accompanying drawings, and other features and advantages of the present invention become clear.

BRIEF DESCRIPTION OF THE DRAWINGS

The accompanying drawings constituting one part of this specification that describe the embodiments and implementations of the present disclosure, and are used in conjunction with this specification for explaining and illustrating principles of the present disclosure.

The present disclosure can be understood more clearly with reference to the accompanying drawings according to the following detailed descriptions.

DETAILED DESCRIPTION

The exemplary embodiments and implementations of the present disclosure are described in detail with reference to the accompanying drawings. It should be noted that, unless otherwise specified in detail, relative disposition, mathematical expression, and values of components and steps elaborated in these embodiments and implementations do not limit the scope of the present invention.

In addition, it should be understood that, for ease of description, sizes of the parts shown in the accompanying drawings are not drawn according to an actual scale relationship.

The following descriptions of at least one exemplary embodiment are for illustration only, and should not be used to limit the present disclosure and application or use of the present disclosure.

Technologies, methods, and devices known by a person of ordinary skill in the related art may not be described in detail. However, in appropriate cases, the technologies, methods, and devices should be construed as one part of the authorized specification.

In all examples shown and described herein, any specific values should be construed as being exemplary only, instead of limitations. Therefore, in other examples of the exemplary embodiments and implementations, there may be different values.

It should be noted that, similar reference numerals and letters in the following accompanying drawings represent similar items. Therefore, once an item is defined in an accompanying drawing, the item does not need to be further described in subsequent accompanying drawings.

The inventor of the present disclosure finds that, in an existing ESD transistor array apparatus, a distance from a gate of each transistor to the substrate contact region may be a physical distance in the layout design shown in FIG. 1A. Because the substrate contact region is located on two sides of the transistor array, a gate of a device (for example, the transistor 102 shown in FIG. 1A) in the middle region of the array is the farthest from the substrate contact region. Consequently, a parasitic resistance from the device in the middle region to the substrate contact region is the greatest. Therefore, when ESD occurs, it is the easiest to improve a substrate voltage of the transistor device in the middle region, and consequently, it is the easiest to turn on the transistor device. After the device is turned on, heat is produced. The heat is easily confined in the middle region of the array and cannot be dissipated easily. As a result, the voltage of the device in the middle region reaches Vt2 more easily, and at this time, a device located on an edge of the array may not be turned on yet, causing the array apparatus to work unevenly, and affecting the performance of the array apparatus.

Figure 2A:
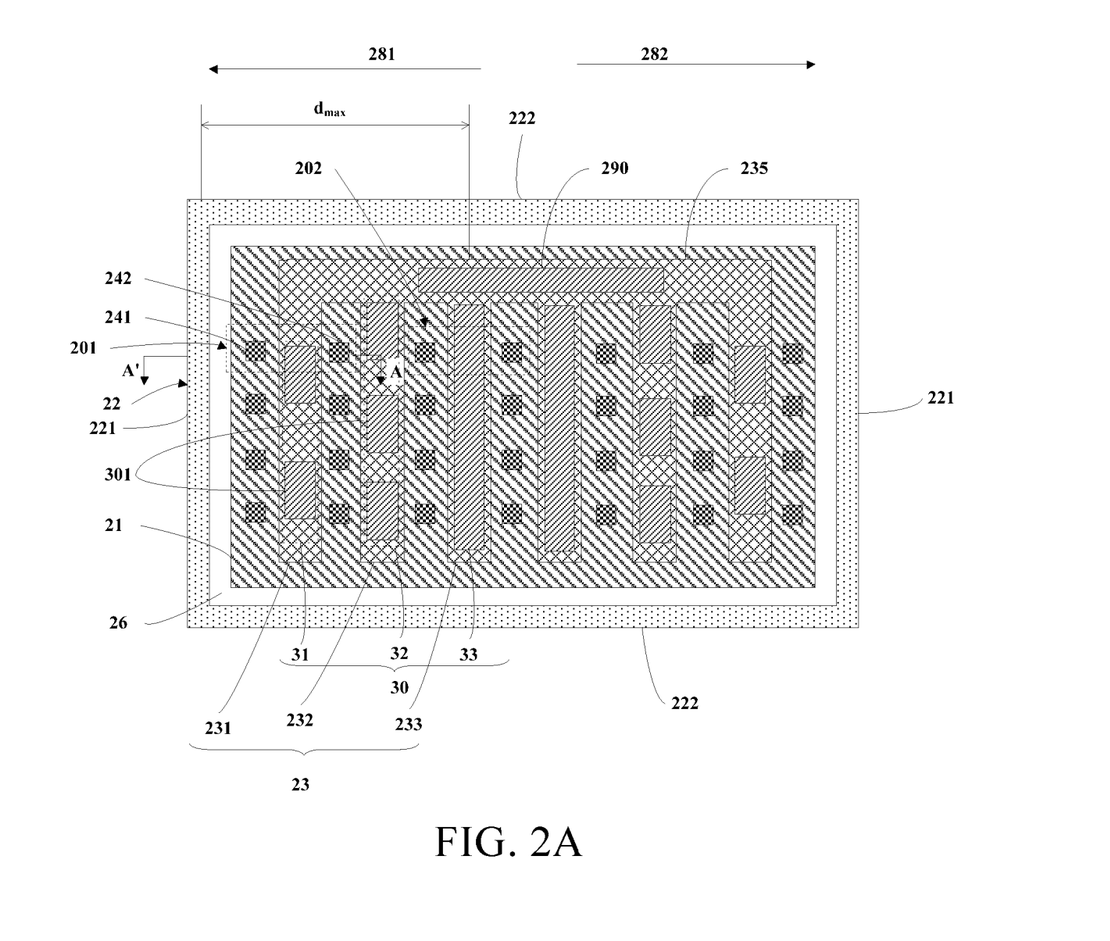
FIG. 2A is a schematic top view of an ESD transistor array apparatus according to one form of the present disclosure.
Figure 2B:
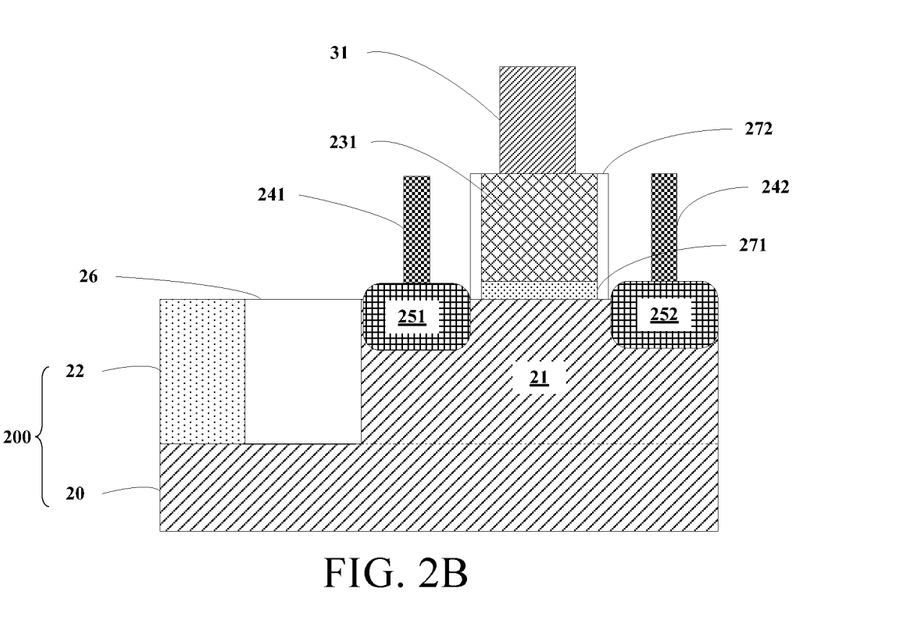
FIG. 2B is a schematic cross-sectional view of a structure along line A-A' in FIG. 2A.

FIG. 2A is a schematic top view of an ESD transistor array apparatus according to one form of the present disclosure. FIG. 2B is a schematic cross-sectional view of a structure along line A-A' in FIG. 2A. FIG. 2B is a schematic cross-sectional view of an ESD transistor in the ESD transistor array apparatus shown in FIG. 2A. The following describes in detail an ESD transistor array apparatus according to one form of the present disclosure with reference to FIG. 2A and FIG. 2B.

As shown in FIG. 2A and FIG. 2B, the ESD transistor array apparatus may include a semiconductor substrate (for example, a silicon substrate) 200. The semiconductor substrate 200 may include: a semiconductor layer 20, a doped region 21 on the semiconductor layer 20, and a substrate contact region 22, where the doped region 21 and the substrate contact region 22 are isolated. The doped region 21 may be an active region. For example, as shown in FIG. 2B, the doped region 21 may be a doped semiconductor fin. For example, the doped region may include multiple doped semiconductor fins isolated on the semiconductor layer 20, where each gate traverses at least one semiconductor fin. For example, in the ESD transistor array apparatus, the same semiconductor fin is used for multiple ESD transistors in a same horizontal row, and different isolated semiconductor fins are used for ESD transistors in different rows. Each gate traverses the multiple semiconductor fins. It should be noted that the doped region shown in FIG. 2A is only schematic, the doped region may further include STIs (not shown in FIG. 2A) and the like isolating the multiple semiconductor fins. In addition, FIG. 3A in subsequent description is similar thereto.

As shown in FIG. 2A, the substrate contact region 22 may include at least a first contact region part 221 separately disposed on two sides of the doped region 21. Optionally, as shown in FIG. 2A, the substrate contact region 22 may further include a second contact region part 222 intersecting with (for example, perpendicular to) the direction of extension of the first contact region part 221. As shown in FIG. 2A, the first contact region part 221 and the second contact region part 222 jointly surround the doped region 21.

Optionally, as shown in FIG. 2A and FIG. 2B, the ESD transistor array apparatus may further include a trench isolation portion 26 isolating the doped region 21 from the substrate contact region 22. For example, the trench isolation portion 26 may include: a trench between the doped region 21 and the substrate contact region 22 and a trench insulator layer (for example, silica) at least partially filling the trench.

It should be noted that the dashed line in FIG. 2B is used only for ease of illustrating the structure, and an actual structure does not necessarily include a real dashed line. FIG. 3B in subsequent description is similar thereto.

As shown in FIG. 2A, the ESD transistor array apparatus may further include multiple gates 23 arranged in parallel on the doped region 21. A direction of extension of the multiple gates 23 is in parallel with a direction of extension of the first contact region part 221. For example, materials of the gate may be polycrystalline silicon. For example, the multiple gates 23 include at least: a first gate 231 having a distance closest to the first contact region part 221, a third gate 233 having a distance (where the distance is $d_{max}$) farthest from the first contact region part 221, and a second gate 232 between the first gate 231 and the third gate 233. FIG. 2B schematically shows the first gate 231. As shown in FIG. 2B, the ESD transistor array apparatus may further include: a gate dielectric layer (for example, silica) 271 between a gate (for example, the first gate 231) and the doped region 21, and a spacer layer (for example, silica and/or silicon nitride) 272 on two side surfaces on two sides of the gate.

As shown in FIG. 2A, the ESD transistor array apparatus may further include a dissipation layer contact member 30 disposed on each gate 23 along the direction of extension of the gate. Density of the dissipation layer contact member 30 decreases with a decrease in a distance from the gate on which the dissipation layer contact member is located to the first contact region part 221 on a corresponding side. In some implementations, materials of the dissipation layer contact member may include metal such as tungsten. A favorable heat dissipation effect can be achieved by using tungsten as the materials of the dissipation layer contact member.

It should be noted that the term "density" herein refers to a proportion of the area of the dissipation layer contact member per unit area of the entire array apparatus. For example, as shown in FIG. 2A, the dissipation layer contact member may include: a first dissipation layer contact member 31 on the first gate (that is, the gate closest to the first contact region part 221 on the corresponding side) 231 located on the edge part of the array apparatus, a second dissipation layer contact member 32 on the second gate 232, and a third dissipation layer contact member 33 on the third gate (that is, the gate farthest from the first contact region part 221 on the corresponding side) 233 located in the middle region of the array apparatus. In the three dissipation layer contact members, the area of the third dissipation layer contact member 33 accounts for the largest proportion, that is, the density of the third dissipation layer contact member 33 is the highest, and the area of the first dissipation layer contact member 31 accounts for the smallest proportion, that is, the density of the first dissipation layer contact member 31 is the lowest.

It should be further noted that the "distance from the gate to the first contact region part on the corresponding side" refers to a distance from the gate to the first contact region part on the side closest to the gate. The following is similar thereto. For example, as shown in FIG. 2A, a distance from a gate in the left half part of the ESD transistor array apparatus to the first contact region part on the corresponding side refers to a distance (for example, a maximum distance $d_{max}$) from the gate to the first contact region part on the left of the doped region. A distance from a gate in the right half part of the ESD transistor array apparatus to the first contact region part on the corresponding side refers to a distance from the gate to the first contact region part on the right of the doped region.

For example, as shown in FIG. 2A, density of dissipation layer contact members in the left half part of the ESD transistor array apparatus gradually decreases along a direction 281. The direction 281 indicates a direction in which distances between gates in the left half part and the first contact region part 221 located on the left of the doped region 21 gradually decrease. In addition, density of dissipation layer contact members in the right half part of the ESD transistor array apparatus gradually decreases along a direction 282. The direction 282 indicates a direction in which distances between gates in the right half part and the first contact region part 221 located on the right of the doped region 21 gradually decrease.

In forms of the ESD transistor array apparatus described above, a dissipation layer contact member is disposed on each gate of the ESD transistor array apparatus, and a density of the dissipation layer contact member decreases with a decrease in a distance from the gate on which the dissipation layer contact member is located to a first contact region part on a corresponding side, so that the density of a dissipation layer contact member in the middle region of the ESD transistor array apparatus is the highest, and a dissipation layer contact member closer to the first contact region part has lower density. This helps to dissipate more heat confined in the middle region of the array, thereby helping reduce the temperature. In addition, a device located on an edge is not significantly affected. Therefore, uniform heat dissipation of the entire ESD transistor array apparatus can be achieved, a problem in the prior art that a device located on an edge of an array may not be turned on yet when a voltage of a device in a middle region reaches Vt2 quickly does not easily occur, and further, the entire ESD transistor array can work evenly.

In some implementations, the dissipation layer contact member 30 (for example, a first dissipation layer contact member 31 shown in FIG. 2B) is in a suspension state. That is, the dissipation layer contact member is neither grounded nor connected to a power supply voltage. This helps dissipate heat generated by the device, and improve heat dissipation efficiency.

In some implementations, one dissipation layer contact member is disposed on each gate or multiple dissipation layer contact members arranged in parallel are disposed on each gate. In some implementations, as shown in FIG. 2A, each dissipation layer contact member 30 disposed on each gate includes multiple contact member segments 301. A quantity of the multiple contact member segments 301 disposed on each gate decreases with a decrease in a distance from the gate on which the multiple contact member segments are located to the first contact region part 221 on a corresponding side. For example, three contact member segments 301 are disposed on the second gate 232, and two contact member segments 301 are disposed on the first gate 231 having a distance closer to the first contact region part 221. In some implementations, areas of the contact member segments 301 may be substantially equal. Certainly, in some other implementations, the areas of these contact member segments may not be equal.

It should be noted that, the "one dissipation layer contact member" or each of the "multiple dissipation layer contact members" disposed on each gate described herein refers to an entirety of contact member segments arranged along a same straight line. Several contact member segments marked by a dashed line box extending in the direction of extension of the gate shown in FIG. 2A may be used as a dissipation layer contact member. FIG. 2A shows that one dissipation layer contact member is disposed on each gate.

For example, as shown in FIG. 2A, the two contact member segments disposed on the first gate 231 are arranged in a same straight line. Therefore, the two contact member segments may be used as the first dissipation layer contact member 31. Similarly, the three contact member segments of the dissipation layer contact member that are disposed on the second gate 232 are arranged in a same straight line. Therefore, the three contact member segments are used as a second dissipation layer contact member 32.

In some implementations, the multiple contact member segments of each dissipation layer contact member disposed on a gate having the farthest distance from the first contact region part 221 on the corresponding side may be integrally connected. For example, as shown in FIG. 2A, multiple contact member segments disposed on the third gate 233 may be integrally connected. This helps dissipate more heat for the ESD transistor on which the gate is located more quickly, and manufacturing is convenient.

In other implementations, the multiple contact member segments disposed on a gate having the farthest distance from the first contact region part 221 may be separated from each other, provided that a quantity of the contact member segments on the gate is greater than a quantity of contact member segments on another gate having a distance closer to the first contact region part. For example, four or five contact member segments (which are more than the three contact member segments on the second gate, and are even more than the two contact member segments on the first gate) may be disposed on the third gate 233. This can also improve heat dissipation efficiency in the middle region of the array apparatus.

In some implementations, the multiple contact member segments of each dissipation layer contact member disposed on each gate having a distance not the farthest from the first contact region part on the corresponding side are separated from each other. For example, as shown in FIG. 2A, three contact member segments separated from each other are disposed on the second gate 232, and two contact member segments separated from each other are disposed on the first gate 231.

In foregoing embodiments and implementations, different quantities of contact member segments are disposed on the gates, so that dissipation layer contact members on the gates have different density. In this way, the density of a dissipation layer contact member decreases with a decrease in a distance from the gate on which the dissipation layer contact member is located to the first contact region part on the corresponding side.

In other implementations, when the areas of the gates are substantially equal, dissipation layer contact members having different areas (which can make the areas account for different proportions) and that are integrally formed, may be disposed on the gates. Therefore, the dissipation layer contact members on each gate can have different density. For example, one integrally formed dissipation layer contact member may be separately disposed on the first gate 231, the second gate 232, and the third gate 233. In these dissipation layer contact members, the area of the dissipation layer contact member on the first gate 231 is smaller than the area of the dissipation layer contact member on the second gate 232 and smaller than the area of the dissipation layer contact member on the third gate 233. For example, when the widths of the dissipation layer contact member are equal, disposition only needs to be performed in the following manner: the length of the dissipation layer contact member on the first gate 231 is less than the length of the dissipation layer contact member on the second gate 232 and is less than the length of the dissipation layer contact member on the third gate 233. This can also achieve an effect of uniform heat dissipation of the array apparatus to some extent.

In some implementations, as shown in FIG. 2A and FIG. 2B, the ESD transistor array apparatus may further include: at least one source 251 and at least one drain 252 in the doped region 21 that are arranged separately on two sides of each gate along the direction of extension of the gate. For example, there may be multiple sources and multiple drains on the two sides of each gate. Herein, each gate and each source and drain on the two sides of the gate are used as a gate, a source, and a drain of each ESD transistor. For example, FIG. 2A shows an ESD transistor 201 having a distance closest the first contact region part on the left side and an ESD transistor 202 having a distance farthest from the first contact region part on the left side.

In some implementations, a source or a drain between adjacent gates is a source or a drain shared by the adjacent gates. For example, two adjacent gates may share one or more sources or drains.

In some implementations, as shown in FIG. 2A and FIG. 2B, the ESD transistor array apparatus may further include: a source contact member 241 on each source 251 and a drain contact member 242 on each drain 252. For example, materials of the source contact member 241 and the drain contact member 242 may include metal such as tungsten.

In some implementations, the ESD transistor array apparatus may include multiple ESD transistors, such as ESD transistors 201 and 202. Each gate and each source and drain on the two sides of the gate may be used as a gate, a source, and a drain of each ESD transistor. In some implementations, the ESD transistor may be a GGNMOS transistor. For example, the multiple gates may be connected together and grounded. For example, as shown in FIG. 2A, the ESD transistor array apparatus may further include: a connecting portion (for example, polycrystalline silicon) 235 connecting the multiple gates 23 together, and a gate contact member (for example, metal such as tungsten) 290 on the connecting portion 235. The gate contact member 290 may be grounded.

In foregoing embodiments and implementations, the ESD transistor array apparatus may be a GGNMOS transistor array apparatus. A dissipation layer contact member is disposed on each gate of the GGNMOS transistor array apparatus, and the density of the dissipation layer contact member decreases with a decrease in a distance from the gate on which the dissipation layer contact member is located to a first contact region part on a corresponding side, so that the density of a dissipation layer contact member in the middle region of the ESD transistor array apparatus is the highest, and a dissipation layer contact member closer to the first contact region part has lower density. This helps dissipate more heat confined in the middle region of the array, thereby helping reduce the temperature. In addition, a device located on an edge is not significantly affected. Therefore, uniform heat dissipation of the entire GGNMOS transistor array apparatus can be achieved, and further, the entire GGNMOS transistor array apparatus can work evenly.

Figure 3A:
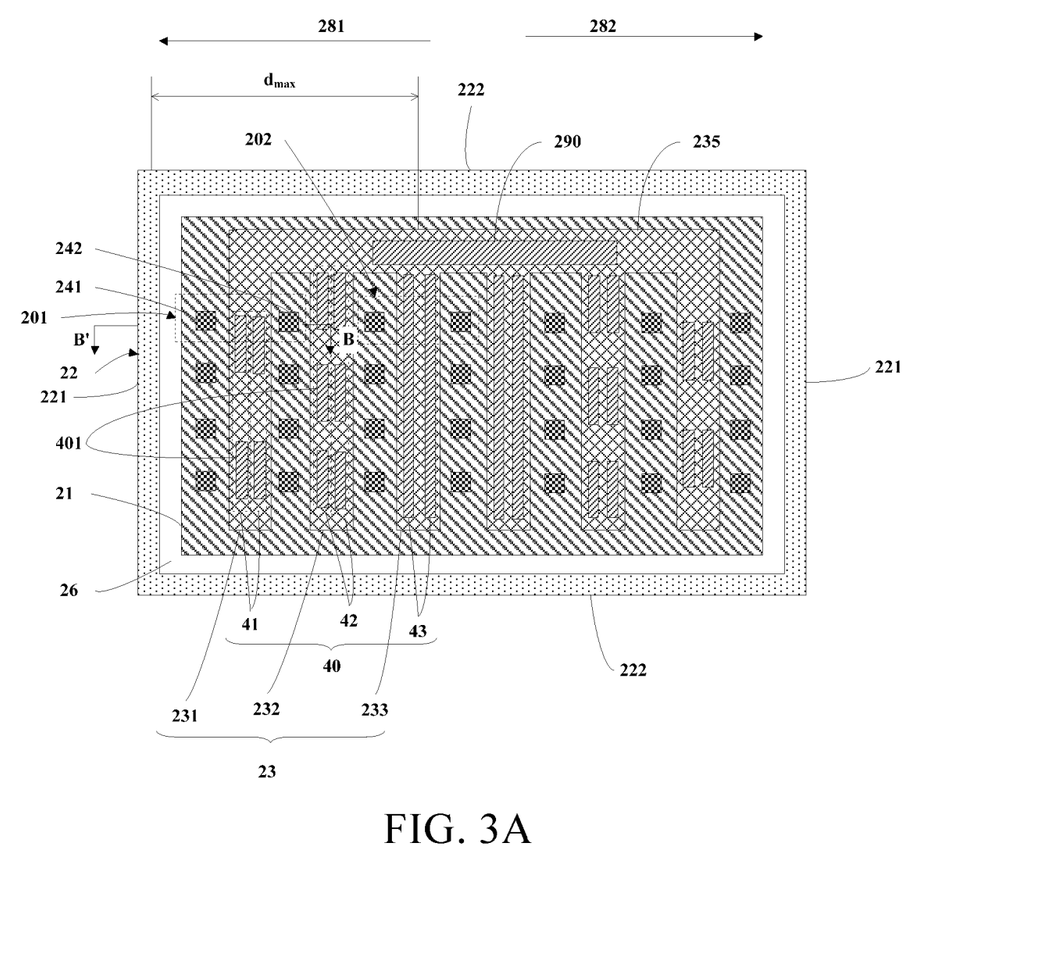
FIG. 3A is a schematic top view of an ESD transistor array apparatus according to another form of the present disclosure.
Figure 3B:
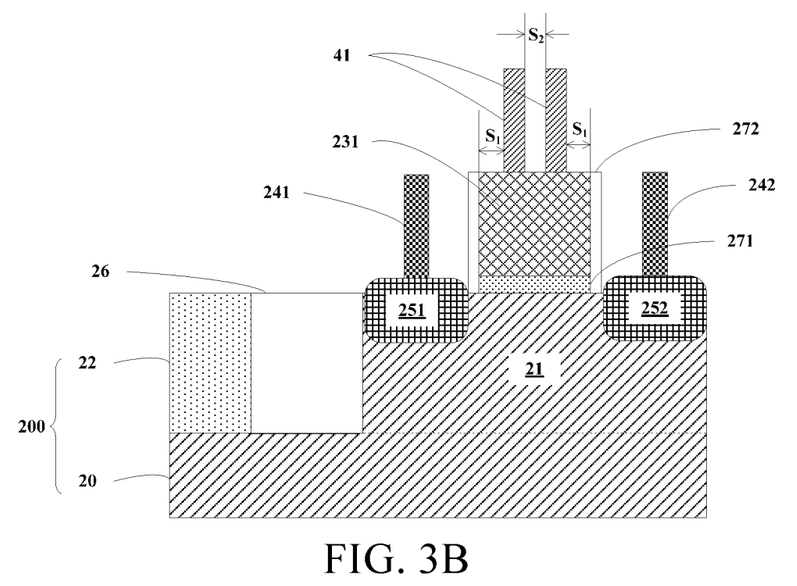
FIG. 3B is a schematic cross-sectional view of a structure along line B-B' in FIG. 3A.

FIG. 3A is a schematic top view of an ESD transistor array apparatus according to another form of the present disclosure. FIG. 3B is a schematic cross-sectional view of a structure along line B-B' in FIG. 3A. FIG. 3B is a schematic cross-sectional view of an ESD transistor in the ESD transistor array apparatus shown in FIG. 3A. The following describes in detail an ESD transistor array apparatus according to another embodiment of the present invention with reference to FIG. 3A and FIG. 3B.

The structure of the ESD transistor array apparatus shown in FIG. 3A is similar to the structure of the ESD transistor array apparatus shown in FIG. 2A. For the same or similar structures, details are not described herein again. A difference between the ESD transistor array apparatus shown in FIG. 3A and the ESD transistor array apparatus shown in FIG. 2A lies in that: as shown in FIG. 3, two dissipation layer contact members 40 arranged in parallel are disposed on each gate 23. For example, two first dissipation layer contact members 41 are disposed on the first gate 231, two second dissipation layer contact members 42 are disposed on the second gate 232, and two third dissipation layer contact members 43 are disposed on the third gate 233.

In some implementations, each dissipation layer contact member 40 disposed on each gate includes multiple contact member segments 401. A quantity of the multiple contact member segments 401 disposed on each gate decreases with a decrease in a distance from the gate on which the multiple contact member segments are located to the first contact region part 221 on a corresponding side. For example, six contact member segments 401 (where each second dissipation layer contact member 42 includes three contact member segments 401) are disposed on the second gate 232, and four contact member segments 401 (where each first dissipation layer contact member 41 includes two contact member segments 401) are disposed on the first gate 231 having a distance closer to the first contact region part 221.

It should be noted that, similar to the foregoing description, each of the "two dissipation layer contact members" disposed on each gate described herein refers to an entirety of contact member segments arranged along a same straight line. Several contact member segments marked by a dashed line box extending in the direction of extension of the gate shown in FIG. 3A may be used as a dissipation layer contact member. Therefore, in the ESD transistor array apparatus shown in FIG. 3, two dissipation layer contact members are disposed on each gate.

As shown in FIG. 3B, using the first dissipation layer contact member 41 as an example, the two dissipation layer contact members are isolated on each gate, for example, a spacing distance $S_2$ may be greater than 0.04 μm. In addition, the two dissipation layer contact members do not exceed the gate on which they are located. For example, a distance $S_1$ between each dissipation layer contact member and an edge of the gate may be greater than 0.05 μm. This can prevent the dissipation layer contact member on the gate from being connected to an adjacent source contact member or drain contact member.

In forms of an ESD transistor array apparatus of the present disclosure, two dissipation layer contact members are disposed on each gate of the ESD transistor array apparatus, so that heat dissipation of the ESD transistor array apparatus can be achieved more easily. The density of the dissipation layer contact member decreases with a decrease in a distance between the gate on which the dissipation layer contact member is located to the first contact region part on a corresponding side. This helps dissipate more heat confined in the middle region of the array, and a device located on an edge is not significantly affected. Therefore, uniform heat dissipation of the entire ESD transistor array apparatus can be achieved, and further, the entire ESD transistor array can work evenly.

It should be noted that although FIG. 2A shows that one dissipation layer contact member is disposed on each gate and FIG. 3A shows that two dissipation layer contact members are disposed on each gate, the scope of the present invention is not limited thereto. For example, more than two dissipation layer contact members, for example, three or four dissipation layer contact members may be disposed on each gate.

Aspects of the present disclosure have been described in detail. In order to not obstruct the concepts of the present disclosure, some details known in the art are not described. A person skilled in the art will understand, according to the foregoing descriptions, how to implement the technical solutions disclosed herein.

Although some particular embodiments and implementations of the present disclosure have been described in detail by using examples, a person skilled in the art can understand that the foregoing examples are merely used for description and not used to limit the scope of the present disclosure. A person skilled in the art should understand that modifications can be made to the foregoing embodiments and implementations without departing from the scope and spirit of the present disclosure. The scope of the present disclosure is limited by the appended claims.

What is claimed is:

1. An electro-static discharge (ESD) transistor array apparatus, comprising:
a semiconductor substrate, the semiconductor substrate comprising:
a semiconductor layer,
a doped region on the semiconductor layer, and
a substrate contact region,
wherein the doped region and the substrate contact region are isolated, and the substrate contact region comprises at least a first contact region part separately disposed on two sides of the doped region;
multiple gates arranged in parallel on the doped region, where a direction of extension of the multiple gates is in parallel with a direction of extension of the first contact region part; and
a dissipation layer contact member disposed on each gate of the multiple gates along the direction of extension of the gate, wherein a density of the dissipation layer contact member decreases with a decrease in a distance from the gate on which the dissipation layer contact member is located to the first contact region part on a corresponding side.

2. The ESD transistor array apparatus according to claim 1, wherein:
one dissipation layer contact member is disposed on each gate, or
multiple dissipation layer contact members arranged in parallel are disposed on each gate.

3. The ESD transistor array apparatus according to claim 2, wherein each dissipation layer contact member disposed on each gate comprises multiple contact member segments, and
wherein a quantity of the multiple contact member segments disposed on each gate decreases with a decrease in a distance from the gate on which the multiple contact member segments are located to the first contact region part on a corresponding side.

4. The ESD transistor array apparatus according to claim 3, wherein the multiple contact member segments of each dissipation layer contact member disposed on a gate having a farthest distance from the first contact region part on the corresponding side are integrally connected.

5. The ESD transistor array apparatus according to claim 3, wherein the multiple contact member segments of each dissipation layer contact member disposed on each gate having a distance that is not a farthest from the first contact region part on the corresponding side are separated from each other.

6. The ESD transistor array apparatus according to claim 1, wherein the dissipation layer contact member is in a suspension state.

7. The ESD transistor array apparatus according to claim 1, wherein materials of the dissipation layer contact member comprise tungsten.

8. The ESD transistor array apparatus according to claim 1, further comprising:
at least one source and at least one drain in the doped region that are arranged separately on two side of each gate along the direction of extension of the gate.

9. The ESD transistor array apparatus according to claim 8, wherein a source or a drain between adjacent gates is a source or a drain shared by the adjacent gates.

10. The ESD transistor array apparatus according to claim 8, further comprising:
a source contact member on each source and a drain contact member on each drain.

11. The ESD transistor array apparatus according to claim 1, wherein the substrate contact region further comprises a second contact region part intersecting with the direction of extension of the first contact region part, and
wherein the first contact region part and the second contact region part jointly surround the doped region.

12. The ESD transistor array apparatus according to claim 1, further comprising:
a trench isolation portion isolating the doped region from the substrate contact region.

13. The ESD transistor array apparatus according to claim 1, wherein:
the doped region is an active region; and
the doped region comprises multiple doped semiconductor fins isolated on the semiconductor layer, wherein each gate traverses at least one semiconductor fin.

14. The ESD transistor array apparatus according to claim 8, wherein the ESD transistor array apparatus comprises multiple ESD transistors, where each gate and each source and drain on two sides of the gate are used as a gate, a source, and a drain of each ESD transistor, and the ESD transistor is a gate-grounded N-channel metal oxide semiconductor (GGNMOS) transistor.

* * * * *